(12) United States Patent
Terasawa

(10) Patent No.: US 6,947,210 B2
(45) Date of Patent: Sep. 20, 2005

(54) CATOPTRIC PROJECTION OPTICAL SYSTEM, EXPOSURE APPARATUS AND DEVICE FABRICATION METHOD USING SAME

(75) Inventor: Chiaki Terasawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 98 days.

(21) Appl. No.: 10/359,868

(22) Filed: Feb. 6, 2003

(65) Prior Publication Data

US 2003/0147130 A1 Aug. 7, 2003

(30) Foreign Application Priority Data

Feb. 7, 2002 (JP) ........................................ 2002-030408

(51) Int. Cl.[7] .............................................. G02B 17/00
(52) U.S. Cl. ........................ 359/366; 359/731; 359/859
(58) Field of Search ........................ 359/368, 858–859, 359/861, 729–731, 351, 365–366, 359

(56) References Cited

U.S. PATENT DOCUMENTS

| | | | |
|---|---|---|---|
| 5,805,365 A | 9/1998 | Sweatt | 359/858 |
| 5,815,310 A * | 9/1998 | Williamson | 359/365 |
| 6,109,756 A | 8/2000 | Takahashi | 359/857 |
| 6,142,641 A | 11/2000 | Cohen et al. | 359/859 |
| 6,213,610 B1 | 4/2001 | Takahashi et al. | 359/858 |
| 6,244,717 B1 | 6/2001 | Dinger | 359/859 |
| 6,302,548 B2 | 10/2001 | Takahashi et al. | 359/858 |
| 6,556,648 B1 * | 4/2003 | Bal et al. | 378/34 |

FOREIGN PATENT DOCUMENTS

| | | |
|---|---|---|
| DE | 199 23 609 A1 | 12/1999 |
| DE | 19923609 A1 | 12/1999 |
| DE | 101 57 045 A1 | 9/2002 |
| EP | 0779528 A3 | 6/1997 |
| EP | 0 779 528 A2 | 6/1997 |
| JP | 2000-98228 | 4/2000 |
| WO | WO 02/056114 A2 | 7/2002 |

* cited by examiner

Primary Examiner—Mark A. Robinson
Assistant Examiner—Lee Fineman
(74) Attorney, Agent, or Firm—Morgan & Finnegan, LLP

(57) ABSTRACT

A catoptric projection optical system for projecting a pattern on an object surface onto an image surface and for serving as an imaging system that forms an intermediate image includes first, second, third and fourth mirrors serving substantially as a coaxial system so as to sequentially reflect light from an object side to an image side, and being arranged so that light from the object surface to the first mirror may intersect light from the second mirror to the third mirror.

5 Claims, 4 Drawing Sheets

CATOPTRIC PROJECTION OPTICAL SYSTEM, EXPOSURE APPARATUS AND DEVICE FABRICATION METHOD USING SAME

BACKGROUND OF THE INVENTION

The present invention relates generally to exposure apparatusses, and more particularly to a reflection type (catoptric) projection optical system, an exposure apparatus, and a device fabricating method using the same. The catoptric projection optical system use ultraviolet ("UV") and extreme ultraviolet ("EUV") light to project and expose an object, such as a single crystal substrate for a semiconductor wafer, and a glass plate for a liquid crystal display ("LCD").

Along with recent demands for smaller and lower profile electronic devices, finer semiconductor devices to be mounted onto these electronic devices have been increasingly demanded. For example, the design rule for mask patterns has required that an image with a size of a line and space ("L & S") of less than 0.1 μm be extensively formed and it is expected to require circuit patterns of less than 80 nm in the near future. The L & S denotes an image projected onto a wafer in exposure with equal line and space widths, and serves as an index of exposure resolution.

A projection exposure apparatus as a typical exposure apparatus for fabricating semiconductor devices includes a projection optical system for projecting and exposing a pattern on a mask or a reticle (these terms are used interchangeably in the present application), onto a wafer. The resolution R of the projection exposure apparatus (i.e., a minimum size for a precise image transfer) can be defined using a light-source wavelength λ and the numerical aperture ("NA") of the projection optical system as in the following equation:

$$R = k_1 \times \frac{\lambda}{NA} \quad (1)$$

As the shorter the wavelength becomes and the higher the NA increases, the better the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light limits usable glass materials for transmitting the light, it is advantageous for the projection optical system to use reflection elements, i.e., mirrors instead of using many refraction elements, i.e., lenses. No applicable glass materials have been proposed for the EUV light as exposure light, and a projection optical system could not include any lenses. It has thus been proposed to form a cataoptric reduction (demagnification) projection optical system only with mirrors.

A mirror in a catoptic reduction projection optical system forms a multilayer film to enhance reflected light and increase reflectance, but the smaller number of mirrors is desirable to increase reflectance of the entire optical system. In addition, the projection optical system preferably uses the even number of mirrors to avoid mechanical interference between the mask and the wafer by arranging the mask and the wafer at opposite sides with respect to a pupil. Apparently, a two-mirror system is the minimum number, but it is difficult to maintain a high NA and good imaging performance only with two mirrors due to its limited freedom of design. Accordingly, Japanese Laid-Open Patent Application No. 2000-98228 has proposed a projection optical system including four mirrors.

The catoptric projection optical system as the four-mirror system proposed in Japanese Laid-Open Patent Application No. 2000-98228 considers an increase of the reflectance in the entire optical system, but disadvantageously has a large span of the optical system and a large maximum effective diameter of the mirror. More specifically, the catoptric projection optical system of a first embodiment has a span of 1451 mm and a maximum effective diameter Φ of 542 mm, while the catoptric projection optical system of a second embodiment has a span of 1279 mm and a maximum effective diameter Φ of 306 mm.

This problem would result in a larger apparatus, lower the transmittance because of the insufficient purge space and vacuum space, and cause manufacture errors due to the manufacture difficulty of a mirror surface, consequently lowering the imaging performance.

BRIEF SUMMARY OF THE INVENTION

Accordingly, it is an exemplified object of the present invention to provide a cataoptric projection optical system with a smaller span and smaller maximum effective diameter for its mirror, as well as exhibiting good imaging performance, an exposure apparatus using the same, and a device fabrication method.

A catoptric projection optical system of one aspect of the present invention for projecting a pattern on an object surface onto an image surface and for serving as an imaging system that forms an intermediate image includes first, second, third and fourth mirrors serving substantially as a coaxial system so as to sequentially reflect light from an object side to an image side, and being arranged so that light from the object surface to the first mirror may intersect light from the second mirror to the third mirror.

The catoptric projection optical system may be a twice-imaging system, and arrange, in order along an optical path from the intermediate image to the image surface, the third mirror and the fourth mirror, the third mirror being a convex mirror whose convex surface faces the object side, and the fourth mirror being a concave mirror whose concave surface faces the image side.

The mirrors may include two mirrors between the object surface and the intermediate image. The two mirrors may be, in order along an optical path from the object side, the first mirror and the second mirror, the first mirror being a concave mirror whose concave surface faces the object side, and the second mirror being a concave mirror whose concave surface faces the image side.

The catoptric projection optical system may further include an aperture stop between the object surface and the first mirror. At least one of the mirrors or all of the mirrors may include an aspheric mirror including a multilayer film. The light may have a wavelength of 200 nm or less or be extreme ultraviolet light having a wavelength of 20 nm or less. The catoptric projection optical system may be telecentric at the image surface side.

An exposure apparatus of another aspect of the present invention includes the above catoptric projection optical system, and irradiating a mask or reticle using circular extreme ultraviolet light corresponding to a circular field of the catoptric projection optical system.

A device fabricating method includes the steps of exposing an object using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
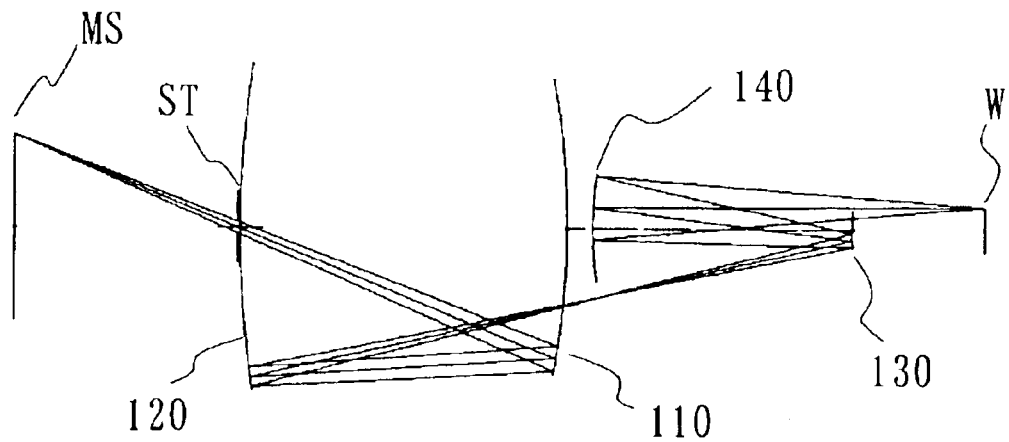
FIG. 1 is a schematic sectional view showing a catoptric projection optical system and its optical path of one embodiment according to the present invention.
Figure 2:
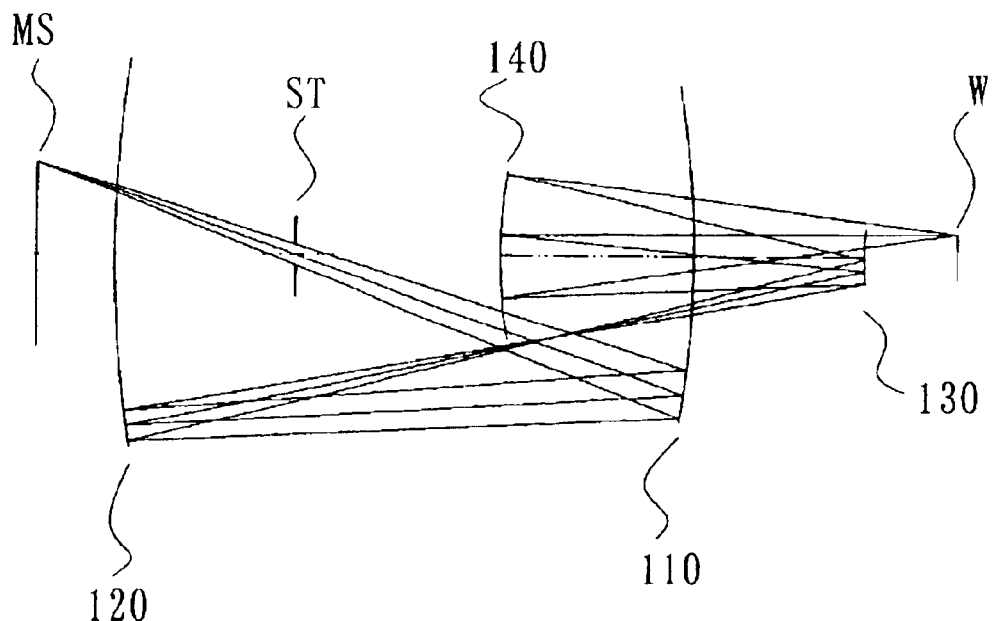
FIG. 2 is a schematic sectional view showing a catoptric projection optical system and its optical path of another embodiment according to the present invention.

A description will now be given of catoptric projection optical system 100 and an exposure apparatus 200 as one aspect of the present invention with reference to the accompanying drawings. The present invention is not limited to these embodiments and each element is replaceable within a scope that achieves the objects of the present invention. The same reference numeral in each figure denotes the same element, and a description thereof will be omitted. Here, FIG. 1 is a schematic sectional view showing the catoptric projection optical system 100 and its optical path of one embodiment according to the present invention. FIG. 2 is a schematic sectional view showing a catoptric projection optical system 100a and its path as a variation of the catoptric reduction projection optical system 100 shown in FIG. 1. Unless otherwise specified, the catoptric projection optical system 100 generalizes the catoptric reduction projection optical system 100a.

Referring to FIG. 1, the inventive catoptric optical system 100 (hereinafter simply called "projection optical system 100") reduces and projects a pattern on an object surface (MS), such as a mask surface, onto an image surface (W), such as a substrate surface and an object surface to be exposed. The catoptric projection optical system 100 is an optical system particularly suitable for the EUV light (with a wavelength of, for example, 13.4 nm). The catoptric projection optical system 100 includes four mirrors that substantially have, in order of reflecting light from the object surface (MS) side, a first (concave) mirror 110, a second (concave) mirror 120, a third (convex) mirror 130, and a fourth (concave) mirror 140.

The inventive projection optical system 100 is arranged substantially as a coaxial system, i.e., a coaxial optical system that is axially symmetrical around one optical axis. However, the respective mirrors 110 to 140 in the projection optical system 100 do not have to be arranged to be perfectly coaxial so as to correct or adjust aberration. For example, they may slightly decenter for aberrational improvements.

The projection optical system 100 arranges the first to fourth mirrors 110 to 140 such that an intermediate image using the first mirror 110 and second mirror 120, and the intermediate image is imaged again on the image surface (W) using the third mirror 130 and fourth mirror 140. Noticeably, light from the object surface (MS) to the first (concave) mirror 110 intersects light from the second (concave) mirror 120 to the third (convex) mirror 130. In other words, the two positive, i.e., first (concave) and second (concave) mirrors 110 and 120 reflect light that has passed through the aperture stop ST from the object surface (MS), thereby thinning a beam diameter and shortening an optical-path length. It may be said that this is similar to a case where field lenses are formed only by a convex lens. The conventional example corresponds to a case where field lenses include a concave lens.

The inventive projection optical system 100 of such a configuration is a four-mirror system, and advantageously increases the reflectance in the entire optical system. In addition, as described above, it realizes a shortened effective diameter and span, solving the problems in the conventional configuration. Outgoing light in the inventive projection optical system 100 is maintained telecentric at the side of the image surface (W), and the magnifying power is less affected even when the image surface (W) moves along the optical-axis direction.

As the projection optical system 100 is arranged as a coaxial system, it may advantageously correct aberration in the ring-shaped image surface around the optical axis as a center. The projection optical system 100 is an intermediate-image forming optical system, and provides well-balanced aberrational corrections.

The first to fourth mirrors 110 to 140 are convex or concave mirrors as described above, but the present invention does not limit the mirrors 110 to 140 to a combination of the above convex and concave mirrors. Of course, a formation of an intermediate image using the first and second mirrors 110 and 120 as in the instant embodiment, and a reformation of the image using the third and forth mirrors 130 and 140 would determine shapes of some mirrors to some extent.

Preferably, the third and fourth mirrors 130 and 140 are convex and concave mirrors, respectively, for imaging with a predetermined NA and a back focus. Here, a "back focus" means an interval between the last mirror (i.e., fourth mirror) surface and the image surface (W). The first and second mirrors 110 and 120 are preferably concave mirrors to reflect the principal ray from the object surface (MS) and bring it close to the optical axis. The mirror shape should be determined as described later so that the sum of the Petzval terms may be zero or in the neighborhood of zero.

Although the instant embodiment configures, as described above, the first to fourth mirrors 110 to 140 as a concave or convex mirror, and forms aspheric shapes on their reflection surfaces, at least one or more mirrors out of the first to fourth mirrors 110 to 140 have an aspheric surface according to the present invention. As a mirror having an aspheric surface advantageously facilitates a correction of aberration, the aspheric surface is preferably applied to many possible (desirably, four) mirrors. A shape of the aspheric surface in these first to fourth mirrors 110 to 140 is defined as Equation 2 as an equation of a generic aspheric surface:

$$Z = \frac{ch^2}{1 + \sqrt{1 - (1+k)c^2 h^2}} + Ah^4 + Bh^6 + \\ Ch^8 + Dh^{10} + Eh^{12} + Fh^{14} + Gh^{16} + Hh^{18} + Jh^{20} + \ldots \quad (2)$$

where "Z" is a coordinate in an optical-axis direction, "c" is a curvature (i.e., a reciprocal number of the radius r of curvature), "h" is a height from the optical axis, "k" a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

These four, i.e., first to fourth, mirrors 110 to 140 have the sum of the Petzval terms in the neighborhood of zero or preferably zero in order to flatten the image surface (W) in the optical system. Thereby, a sum of refracting power of each mirror surface is made nearly zero. In other words, where $r_{110} \sim r_{140}$ are the radii of curvature for respective mirrors (in which subscripts correspond to the reference numerals of the mirrors), the first to fourth mirrors 110 to 140 in this embodiment meet the Equation 3 or 4:

$$\frac{1}{r_{110}} - \frac{1}{r_{120}} + \frac{1}{r_{130}} - \frac{1}{r_{140}} = 0 \quad (3)$$

$$\frac{1}{r_{110}} - \frac{1}{r_{120}} + \frac{1}{r_{130}} - \frac{1}{r_{140}} \approx 0 \quad (4)$$

A multilayer film for reflecting the EUV light is applied onto the surface of the mirrors 110 to 140, and serves to enhance the light. A multilayer applicable to the mirrors 110 to 140 of the instant embodiment includes, for example, a Mo/Si multilayer film including alternately laminated molybdenum (Mo) and silicon (Si) layers on a mirror's reflection surface or a Mo/Be multilayer film including alternately laminating molybdenum (Mo) and beryllium (Be) layers on the mirror's reflection surface. A mirror including the Mo/Si multilayer film may obtain reflectance of 67.5% for a wavelength range near a wavelength of 13.4 nm, and a mirror including the Mo/Be multilayer film may obtain reflectance of 70.2% for a wavelength range near a wavelength of 11.3 nm. Of course, the present invention does not limit the multilayer film to the above materials, and may use any multilayer film that has an operation or effect similar to that of the above.

The aperture stop ST is adapted to be a variable aperture stop to limit or vary the NA. The aperture stop ST as a variable stop advantageously provides a deeper depth of focus suitable for stabilization of images.

A description will now be given of illumination experiment results using the inventive catoptric projection optical systems 100 and 100*a*. In FIGS. 1 and 2, MS is a catoptric mask located at the object surface, and W is a wafer located at the image surface. The catoptric projection optical systems 100 and 100*a* illuminate the mask MS using an illumination system (not shown) for emitting the EUV light with a wavelength of about 13.4 nm, and reflects the reflected EUV light from the mask MS via the first (concave) mirror 110, second (concave) mirror 120, third (convex) mirror 130, and fourth (concave) mirror 140 arranged in this order. Then, a reduced image of the mask pattern is formed on the wafer W located at the image surface. The catoptric projection optical system 100 shown in FIG. 1 has NA=0.10, reduction=¼, an object point of 66 to 70 mm, an image point of 16.5 to 17.5 mm, and an arc-shaped image surface with a width of 1.0 mm. Table 1 indicates the numerical values (such as radius of curvature, surface intervals, and coefficients of aspheric surfaces) of the catoptric projection optical system 100 shown in FIG. 1.

TABLE 1

| MIRROR NUMBERS | RADII OF CURVATURE | SURFACE INTERVALS | CONIC CONSTANTS K |
|---|---|---|---|
| OBJECT SURFACE (MS) | ∞ | 172.56684 | |
| STOP | ∞ | 254.32033 | |
| MIRROR 110 | −619.09469 | −253.32033 | 0.0 |
| MIRROR 120 | 749.01422 | 474.05847 | 0.0 |
| MIRROR 130 | 155.41516 | −200.73814 | 0.0 |
| MIRROR 140 | 278.51516 | 303.12387 | 0.0 |
| IMAGE SURFACE (W) | ∞ | — | — |

| COEFFICIENTS OF ASPHERIC SURFACES | A | B | C | D |
|---|---|---|---|---|
| MIRROR 110 | −1.64726E−10 | 1.40858E−13 | −2.42647E−17 | 2.43815E−21 |
| MIRROR 120 | −2.13483E−9 | 1.34478E−13 | −1.56306E−17 | 9.32137E−22 |
| MIRROR 130 | 6.30335E−8 | 1.82730E−11 | −6.88618E−14 | 1.26327E−16 |
| MIRROR 140 | 3.55780E−10 | −1.90836E−14 | 5.11453E−17 | −6.00216E−20 |
| — | E | F | G | H |
| MIRROR 110 | −1.49181E−25 | 5.11860E−30 | −7.55517E−35 | 0.000000E+00 |
| MIRROR 120 | −2.78084E−26 | 2.63633E−31 | 2.62461E−36 | 0.000000E+00 |
| MIRROR 130 | −2.99256E−26 | −1.42766E−32 | −1.04162E−30 | 0.000000E+00 |
| MIRROR 140 | 3.99062E−23 | −1.40385E−26 | 2.03576E−30 | 0.000000E+00 |

The catoptric projection optical system 100 shown in FIG. 1 includes such aberrations (calculated at several points on the image point) without manufacture errors that wavefront aberration is 0.020 λrms and maximum distortion is −3.3 nm. This is a diffraction limited optical system for a wavelength of 13.4 nm. Here, the optical system has a span of 750 mm, and the maximum effective diameter of 244 mm, which are smaller than the conventional example.

The catoptric projection optical system 100a has NA of 0.16, reduction of ¼, an object point of 66 to 70 mm, an image point of 16.5 to 17.5 mm, and an arc-shaped image surface with a width of 1.0 mm. Table 2 indicates the numerical values (such as radius of curvature, surface intervals, and coefficients of aspheric surfaces) of the catoptric projection optical system 100a shown in FIG. 2.

TABLE 2

| MIRROR NUMBERS | RADII OF CURVATURE | SURFACE INTERVALS | CONIC CONSTANTS K |
|---|---|---|---|
| OBJECT SURFACE (MS) | ∞ | 199.06004 | |
| STOP | ∞ | 308.33555 | |
| MIRROR 110 | −772.74428 | −447.39559 | 0.0 |
| MIRROR 120 | 909.87915 | 578.21133 | 0.0 |
| MIRROR 130 | 193.34365 | −281.03484 | 0.0 |
| MIRROR 140 | 351.80585 | 352.83381 | 0.0 |
| IMAGE SURFACE (W) | ∞ | | |

| COEFFICIENTS OF ASPHERIC SURFACES | A | B | C | D |
|---|---|---|---|---|
| MIRROR 110 | −1.54244E−9 | 2.95932E−13 | −3.44320E−17 | 2.52793E−21 |
| MIRROR 120 | −2.70539E−9 | 2.34953E−13 | −1.84195E−17 | 9.05306E−22 |
| MIRROR 130 | 5.71821E−8 | 4.92787E−12 | −6.79139E−15 | 9.82056E−18 |
| MIRROR 140 | 1.71628E−10 | 2.10410E−15 | −2.01105E−19 | −4.89390E−24 |

| — | E | F | G | H |
|---|---|---|---|---|
| MIRROR 110 | −1.14937E−25 | 2.95820E−30 | −3.29926E−35 | 0 |
| MIRROR 120 | −2.74709E−26 | 4.69406E−31 | −3.45461E−36 | 0 |
| MIRROR 130 | −2.99258E−26 | −1.50692E−32 | −1.53966E−26 | 0 |
| MIRROR 140 | 3.28012E−26 | −9.43431E−30 | 8.46803E−34 | 0 |

The catoptric projection optical system 100a shown in FIG. 2 includes such aberrations (calculated at several points on the image point) without manufacture errors that wavefront aberration is 0.025 λrms and maximum distortion is 4.8 nm. This is a diffraction limited optical system for a wavelength of 13.4 nm. Here, the optical system has a span of 710 mm, and the maximum effective diameter Φ of 288 mm, which are smaller than the conventional example.

As described above, the inventive catoptric projection optical system 100 is a catoptric projection optical system that realizes diffraction limited performance for the wavelength of EUV light, and is relatively small in its span and mirror's effective diameter. Therefore, it may prevent the apparatus from growing large and transmittance from lowering due to the insufficient purge space and vacuum space. In addition, it may reduce or eliminate manufacture errors due to the manufacture difficulty of a mirror surface, and prevent resultant imaging performance from lowering.

Figure 3:
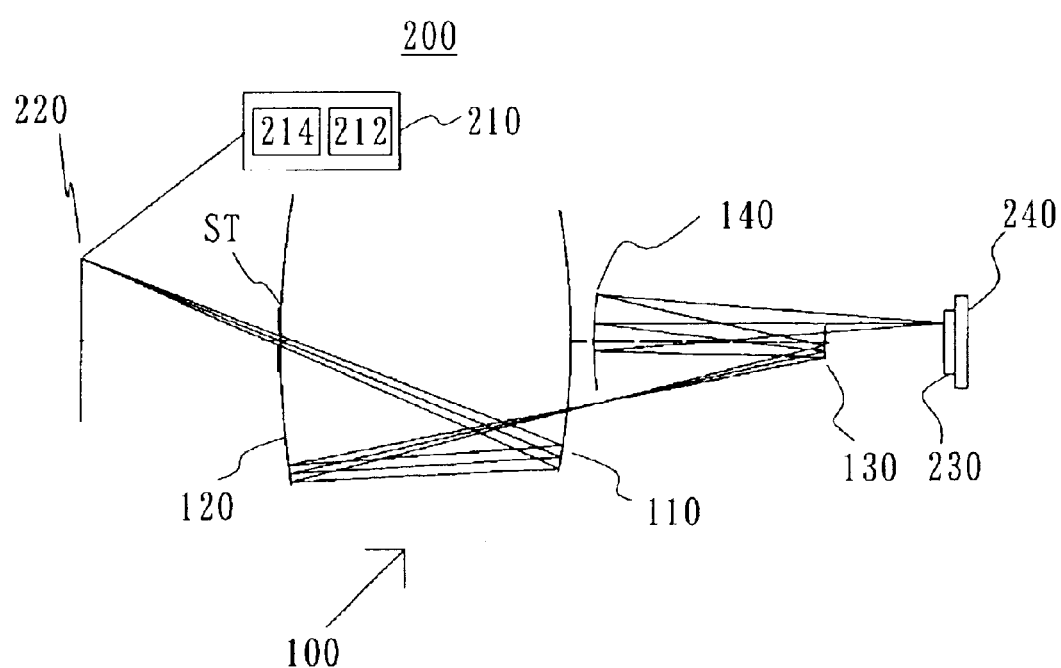
FIG. 3 is a schematic block diagram showing an exposure apparatus that includes a catoptric projection optical system shown in FIG. 1.

A description will be given below of an exposure apparatus 200 including the inventive catoptric projection optical system 100 with reference to FIG. 3. Here, FIG. 3 is a schematic block diagram showing an exposure apparatus 200 that includes a catoptric projection optical system 100 shown in FIG. 1. The exposure apparatus 200 includes, as shown in FIG. 3, an illumination apparatus 210, a reticle 220, a catoptric projection optical system 100, a plate 230, and a plate stage 240.

The exposure apparatus 200 uses EUV light (with a wavelength of, e.g., 13.4 nm) as illumination light for exposure, and exposes onto the plate 230 a circuit pattern created on the mask, for example, in a step-and-scan manner or step-and-repeat manner. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer. At least the optical path through which the EUV light travels should preferably be maintained in a vacuum atmosphere, although not shown in FIG. 3, since the EUV light has low transmittance for air.

The illumination apparatus 210 uses the EUV light (with a wavelength of, for example, 13.4 nm) to illuminate the reticle 220 that forms a circuit pattern to be transferred, and includes an EUV light source 212 and an illumination optical system 214.

The EUV light source 210 uses, for example, a laser plasma light source. The laser plasma light source irradiates a highly intensified pulse laser beam to a target material put in vacuum, thus generating high-temperature plasma for use as EUV light with a wavelength of about 13.4 nm emitted from this. The target material may use a metallic thin film, inert gas, and droplets, etc. The pulse laser preferably has high repetitive frequency, e.g., usually several kHz, for increased average intensity of the emitted EUV light. Alternatively, the EUV light source 212 may use a discharge plasma light source, which emits gas around an electrode put in vacuum, applies pulse voltage to the electrode for discharge, and induces high-temperature plasma. This plasma emits the EUV light, for example, with a wavelength of about 13.4 nm to be utilized. Of course, the EUV light source 212 is not limited to them, but may use any technology known in the art.

The illumination optical system 214 propagates the EUV light, illuminates the reticle 220, and includes a condenser optical system, an optical integrator, an aperture stop, a blade, etc. For example, the condenser optical system includes one or more mirrors for condensing EUV light that is radiated approximately isotropically from the EUV light source 212, and the optical integrator uniformly illuminates the reticle 220 with a predetermined aperture.

A debris eliminator (not shown) is preferably arranged between the EUV light source 212 and the illumination optical system 214 to eliminate debris generated concurrently when the EUV light is produced.

The reticle 220 is a catoptric reticle, and forms a circuit pattern (or image) to be transferred. It is supported and driven by a reticle stage (not shown). The diffracted light emitted from the reticle 220 is projected onto the plate 230 after reflected by the projection optical system 100. The reticle 220 and plate 230 are arranged optically conjugate with each other. Since the exposure apparatus 200 of this embodiment is a scanner, the reticle 220 and plate 230 are scanned with a reduction speed ratio to transfer a pattern on the reticle 220, onto the plate 230. Although the reticle 220 is implemented as a catoptric reticle, the projection optical system 100 reduces the inclination of the principal ray from the reticle 220, and thus is applicable to both the catoptric reticle and transmission type reticle.

Characteristically, the projection optical system 100 includes, in order of reflecting light from the reticle 220 side, the first (concave) mirror 110, second (concave) mirror 120, third (convex) mirror 130, and fourth (concave) mirror 140. The catoptric projection optical system 100 may use any of the above embodiments, and a detailed description thereof will be omitted. Although FIG. 3 uses the catoptric optical system 100 shown in FIG. 1, the present invention is not limited to this illustrative embodiment.

The plate 230 is an exemplary object to be exposed, such as a wafer and a LCD, and photoresist is applied to the plate 230. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 230 is supported by the plate stage 240. The plate stage 240 may use any structure known in the art, and thus a detailed description of its structure and operations will be omitted. For example, the plate stage 240 uses a linear motor to move the plate 230 in X-Y directions. The reticle 220 and plate 230 are, for example, scanned synchronously, and the positions of the reticle stage (not shown) and plate stage 240 are monitored, for example, by a laser interferometer and the like, so that both are driven at a constant speed ratio. The plate stage 240 is installed on a stage stool supported on the floor and the like, for example, via a dumper, and the reticle stage and the projection optical system 100 are installed on a lens barrel stool (not shown) supported, for example, via a dumper to the base frame placed on the floor.

In exposure, the EUV light emitted from the EUV light source 212 illuminates the reticle 220 via the illumination optical system 214. The EUV light that has been reflected on the reticle 220 and reflects the circuit pattern is imaged on the plate 230 by the projection optical system 100.

Figure 4:
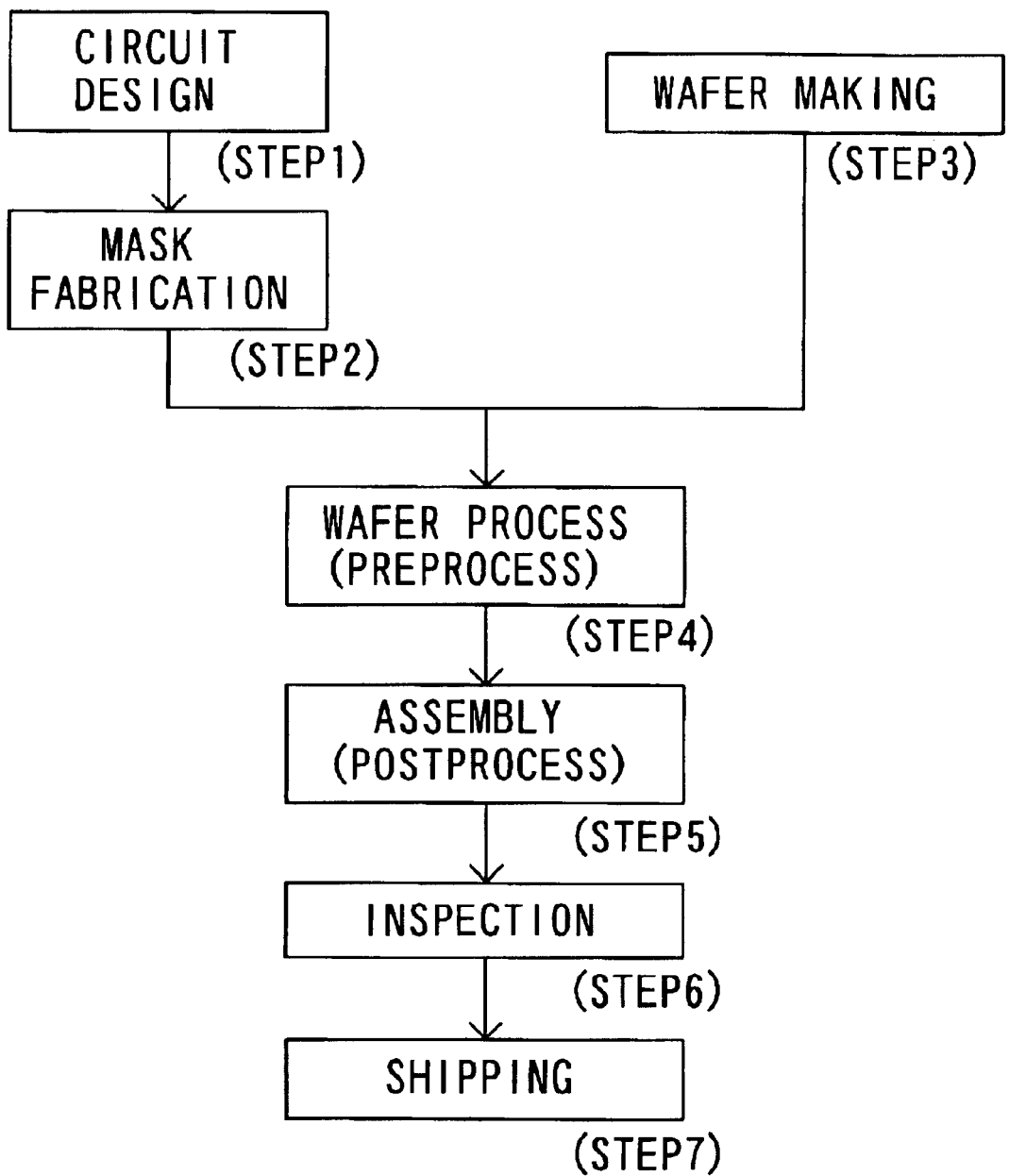
FIG. 4 is a flowchart for explaining a method for fabricating devices (semiconductor chips such as ICs, LSIs, and the like, LCDs, CCDs, etc.).
Figure 5:
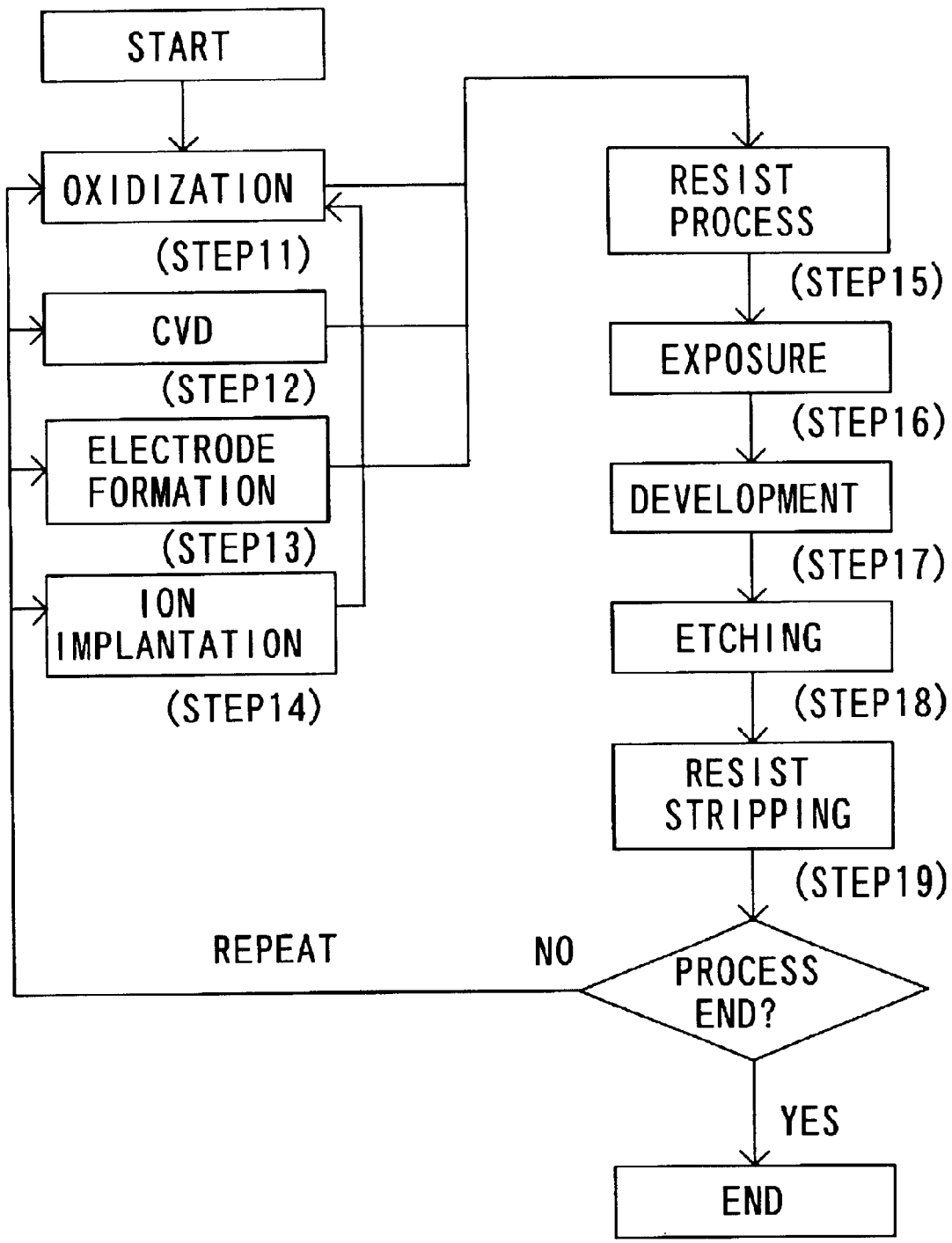
FIG. 5 is a detailed flowchart for Step 4 of wafer process shown in FIG. 4.

Referring to FIGS. 4 and 5, a description will now be given of an embodiment of a device fabricating method using the above mentioned exposure apparatus 200. FIG. 4 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4 shown in FIG. 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these preferred embodiments, and various variations and modifications may be made without departing from the scope of the present invention. For example, the catoptric projection optical system of this embodiment has a coaxial system having a rotationally symmetrical aspheric surface, but it may have a rotationally asymmetrical aspheric surface. The present invention is applicable a catoptric projection optical system for non-EUV ultraviolet light with a wavelength of 200 nm or less, such as ArF excimer laser and $F_2$ excimer laser, as well as to an exposure apparatus that scans and exposes a large screen, or that exposes without scanning.

Thus, according to the inventive catoptric projection optical system, the small number of mirrors, i.e., four may improve the reflectance in the optical system and make small the span of the optical system and mirror's maximum effective diameter. As a result, it may prevent the apparatus from growing large and transmittance from lowering due to the insufficient purge space and vacuum space. In addition, it may reduce or eliminate manufacture errors due to the manufacture difficulty of a mirror surface, and prevent resultant imaging performance from lowering. The exposure apparatus having this catoptric projection optical system may provide high quality devices with excellent exposure performance including a throughput.

What is claimed is:

1. A projection optical system for projecting a pattern on an object surface onto an image surface, said projection optical system comprising, in order of reflecting light from the object side, a first reflection surface, a second concave reflection surface, a third convex reflection surface, and a fourth concave reflection surface, wherein said projection optical system forms an intermediate image of the pattern between said second and third reflection surfaces at a position different from the image surface by said first and second reflection surfaces, and an image of the pattern on the image surface by using light from the intermediate image, wherein non-reflected light from the pattern to said first reflection surface intersects light from said second reflection surface to said third reflection surface.

2. A system according to claim 1, wherein said the projection optical system is a four-mirror system, which includes the first reflection surface to the fourth concave reflection surface.

3. An exposure apparatus for exposing a pattern on an object surface onto an image surface, said exposure apparatus comprising:

an illumination optical system for illuminating the pattern on the object surface by extreme ultraviolet light; and a projection optical system for projecting light from the object surface onto the image surface, wherein said projection optical system includes, in order of reflecting light from the object side, a first concave reflection surface, a second concave reflection surface, a third convex reflection surface, and a fourth concave reflection surface, wherein said projection optical system forms an intermediate image of the pattern between said second and third reflection surfaces at a position different from the image surface by said first and second reflection surfaces, and an image of the pattern on the image surface by using light from the intermediate image, wherein non-reflected light from the pattern to said first reflection surfaces intersects light from said second reflection surface to said third reflection surface.

4. A device fabricating method comprising the steps of:

exposing an object using an exposure apparatus according to claim 3; and developing the exposed object.

5. An apparatus according to claim 4, wherein said the projection optical system is a four-mirror system, which includes the first reflection surface to the fourth concave reflection surface.

* * * * *